United States Patent
Schubert et al.

(10) Patent No.: US 12,401,365 B2
(45) Date of Patent: Aug. 26, 2025

(54) DEVICE AND METHOD FOR DETECTING A HARMONIC STATE

(71) Applicant: Robert Bosch GmbH, Stuttgart (DE)

(72) Inventors: Andreas Schubert, Coswig (DE); Alexander Richter, Dresden (DE)

(73) Assignee: ROBERT BOSCH GMBH, Stuttgart (DE)

( * ) Notice: Subject to any disclaimer, the term of this patent is extended or adjusted under 35 U.S.C. 154(b) by 56 days.

(21) Appl. No.: 18/558,385

(22) PCT Filed: May 3, 2022

(86) PCT No.: PCT/EP2022/061788
§ 371 (c)(1),
(2) Date: Nov. 1, 2023

(87) PCT Pub. No.: WO2022/233832
PCT Pub. Date: Nov. 10, 2022

(65) Prior Publication Data
US 2024/0235559 A1    Jul. 11, 2024

(30) Foreign Application Priority Data

May 5, 2021  (DE) .................. 10 2021 204 500.6

(51) Int. Cl.
*H03L 7/081*    (2006.01)

(52) U.S. Cl.
CPC .................... *H03L 7/0816* (2013.01)

(58) Field of Classification Search
CPC ..... H03L 7/0816; H03L 7/0812; H03L 7/081; H03L 7/10; H03L 7/095; H03L 7/085
See application file for complete search history.

(56) References Cited

U.S. PATENT DOCUMENTS

| | | | | |
|---|---|---|---|---|
| 6,667,643 B2 * | 12/2003 | Ko | ................ | H03L 7/0818 327/158 |
| 8,766,688 B2 | 7/2014 | Choi | | |
| 8,917,129 B1 * | 12/2014 | He | ................ | H03L 7/095 327/159 |
| 2012/0306551 A1 | 12/2012 | Moon et al. | | |
| 2024/0146315 A1 * | 5/2024 | Pothireddy | ........ | H03L 7/0812 |

FOREIGN PATENT DOCUMENTS

CA    2073888 C    10/1996

OTHER PUBLICATIONS

International Search Report for PCT/EP2022/061788, Issued Sep. 5, 2022.
Kim et al., "Wide-Range Harmonic Lock Detector With Real-Time Delay Measurement of Delay-Locked Loop," Electronics Letters, vol. 51, No. 2, 2015, pp. 136-138. <https://sci-hub.ru/10.1049/el.2014.3749> Downloaded Oct. 31, 2023.

* cited by examiner

*Primary Examiner* — Diana J. Cheng
(74) *Attorney, Agent, or Firm* — NORTON ROSE FULBRIGHT US LLP

(57) ABSTRACT

Detection of harmonic states in a delay-locked loop. A plurality of delayed clock signals within the delay-locked loop is evaluated and, on the basis thereof, in particular on the basis of the time points of the rising edges in the delayed clock signals, it is ascertained whether a harmonic state has arisen in the delay-locked loop.

10 Claims, 6 Drawing Sheets

DEVICE AND METHOD FOR DETECTING A HARMONIC STATE

FIELD

The present invention relates to a detector apparatus and to a method for detecting a harmonic state in a delay-locked loop (DLL). The present invention furthermore relates to a control apparatus for a DLL and to a DLL having such a detector apparatus.

BACKGROUND INFORMATION

Precise time synchronization of the sequences is very often necessary for processing electronic signals. Suitable time signals must be provided for this purpose. These time signals can be derived, for example, from a clock signal which serves as a reference signal. If the time resolution, i.e., the time period between two successive rising edges of the reference signal, is not sufficient, signals with a higher time resolution, i.e., smaller time intervals between two rising edges, must be derived from the reference signal. Such a possibility of generating time signals with a higher time resolution from a reference signal consists in generating a multiphase clock signal from the reference signal by means of a delay-locked loop (DLL), in which clock signal the individual clock phases are distributed at equidistant time intervals over a period.

U.S. Pat. No. 8,766,688 B2 describes a DLL with a variable delay unit. The variable delay unit delays an input signal by a variable delay time according to a corresponding control signal. The variable delay time can be adjusted on the basis of a phase difference between the input signal and a feedback clock signal.

SUMMARY

The present invention provides a detector apparatus and a method for detecting a harmonic state in a DLL, a control apparatus for a DLL, and a DLL. Advantageous embodiments of the present invention are disclosed herein.

According to an example embodiment of the present invention, the following is provided:

A detector apparatus for detecting a harmonic state in a DLL. In this case, the DLL comprises a feedback series circuit of a plurality of delay elements. The detector apparatus is designed to detect a harmonic state of the DLL using delayed clock signals from at least two delay elements of the DLL.

Furthermore, according to an example embodiment of the present invention, the following is provided:

A control apparatus for a DLL having a detector apparatus according to the present invention and a regulating device. The regulating device is designed to adjust a delay of the plurality of delay elements of the DLL. The regulating device is designed to adjust the delay of the delay elements of the DLL if the detector device has detected a harmonic state of the DLL.

Furthermore, according to an example embodiment of the present invention, the following is provided:

A DLL having an input terminal, a plurality of delay elements, a regulating device, and a detector apparatus according to the present invention.

The input terminal is designed to receive a reference clock signal. The plurality of delay elements is arranged as a feedback series circuit. In this case, the delay elements are each designed to delay a clock signal provided at an input of the respective delay element, by a predetermined delay time and to provide the delayed clock signal at the output of the respective delay element. The regulating apparatus is designed to adjust the predetermined delay time of the delay elements. In particular, the regulating device is designed to adjust the predetermined delay time using an input clock signal and an output clock signal of the series circuit comprising the plurality of delay elements. Furthermore, the regulating device is designed to adjust a delay of the plurality of delay elements of the DLL if the detector device has detected a harmonic state of the DLL.

Also, according to an example embodiment of the present invention, the following is provided:

A method for detecting a harmonic state in a DLL. The DLL comprises a feedback series circuit of a plurality of delay elements. The method compares delayed clock signals of at least two delay elements of the DLL to one another. Furthermore, using the comparison of the delayed clock signals, the method detects a harmonic state of the DLL.

In a delay-locked loop (DLL), a plurality of clock signals can be generated using a reference signal, wherein the rising edges of the individual clock signals generated are distributed at equidistant time intervals over a period. The delay times of the individual delay elements in the DLL can be set by a phase comparison of the input reference signal to the output signal at the end of the delay elements. In addition to a basic state in which the sum of the delays of the individual delay elements in the DLL corresponds to a period duration of the input reference signal, a so-called harmonic state can also arise in the DLL. In such a harmonic state, the sum of the delays of the individual delay members corresponds to a multiple of the period duration of the input reference signal.

In order to counteract the occurrence of such harmonic states, it is possible on the one hand to take design measures that prevent the occurrence of harmonic states from the outset.

However, this generally has a strongly limiting effect on possible parameters of such a DLL. Alternatively, harmonic states in a DLL can be detected and, after a harmonic state in the DLL has been detected, suitable measures can be initiated in order to transfer the DLL into the basic state.

It is therefore a feature of the present invention to enable a reliable and simple-to-realize detection of harmonic states in a DLL. If a harmonic state of the DLL is detected, suitable measures can be initiated, as already mentioned above, in order to transfer the DLL into the basic state. For detection of a harmonic state in the DLL, it is in this case provided to compare a plurality of delayed clock signals from the outputs of at least second delay elements of the DLL to one another. In particular, by evaluating the time points at which the edges of the delayed clock signals rise, it can be determined whether the DLL is in the basic state or in a harmonic state. The required number of delayed clock signals and the selection as to which delayed clock signals are compared to one another for the detection of the harmonic state also depends, among other things, on the specification as to the extent to which harmonic states are to be detected.

According to one example embodiment of the present invention, at least one of the at least two delayed clock signals is provided by a delay element of the first half of the series circuit comprising a plurality of delay elements. Furthermore, at least one of the at least two delayed clock signals is provided by a delay element of the second half of the series circuit comprising a plurality of delay elements. Accordingly, the comparison of the delayed clock signals and the resulting determination whether a harmonic state of the DLL is present are respectively based on at least one clock signal from the first half of the delay elements and one clock signal from the second half of the delay elements. In addition, if necessary, further clock signals can also be included for the detection of the harmonic state. In particular, even higher-order harmonic states can be reliably detected by using further clock signals.

According to one example embodiment of the present invention, the detector apparatus is designed to detect the harmonic state of the DLL using time points of rising edges of the delayed clock signals from the at least two delay elements. In particular, it is sufficient for the detection of harmonic states to evaluate only the time points of the rising edges of the considered delayed clock signals in order to deduce therefrom the presence of a harmonic state in the DLL.

According to one example embodiment of the present invention, the detector apparatus comprises at least one detector stage. The detector stage is designed to receive delayed clock signals from two delay elements. Furthermore, the detector stage is designed to provide an output signal. In particular, the detector stage is designed to set the output signal as a function of the edges of the received clock signals. The output Substitute Specification signal of the detector stage can be set as a function of the order of the rising edges of the received delayed clock signals.

According to one example embodiment of the present invention, the at least one detector stage respectively comprises two D flip-flops. In this case, a delayed output signal from a delay element is respectively provided at a clock input of the D flip-flop. A D flip-flop is also referred to as a data or delay flip-flop and is one of the clock-controlled flip-flops. In particular, the D flip-flops of the detector stage can be clock-edge-controlled D flip-flops.

According to one example embodiment of the present invention, between an input of the DLL and a first input of the detector stage at which a first delayed clock signal is provided, twice as many delay elements are provided as between the input of the DLL and a second input of the detector stage at which a second delayed clock signal is provided. In other words, a second delayed clock signal that is provided to a detector stage is delayed twice as long as the first delayed clock signal provided at the respective detector stage.

According to one example embodiment of the present invention, the detector apparatus comprises at least two detector stages. In this case, the outputs of the at least two detector stages can be linked to one another by a logical OR operation. By using a plurality of detector stages and logically linking the outputs of the detector stages, it is possible in a simple manner to reliably detect even higher harmonic states of the DLL.

The above embodiments and developments of the present invention can be arbitrarily combined with one another insofar as is reasonable. Further embodiments, developments, and implementations of the present invention also include combinations, even those not explicitly mentioned, of features of the present invention described above or in the following with regard to the exemplary embodiments. The person skilled in the art will in particular also add individual aspects as improvements or additions to the relevant basic form of the present invention, in view of the disclosure herein.

BRIEF DESCRIPTION OF THE DRAWINGS

Further features and advantages of the present invention will be explained in the following with reference to the figures.

DETAILED DESCRIPTION OF EXAMPLE EMBODIMENTS

Figure 1:
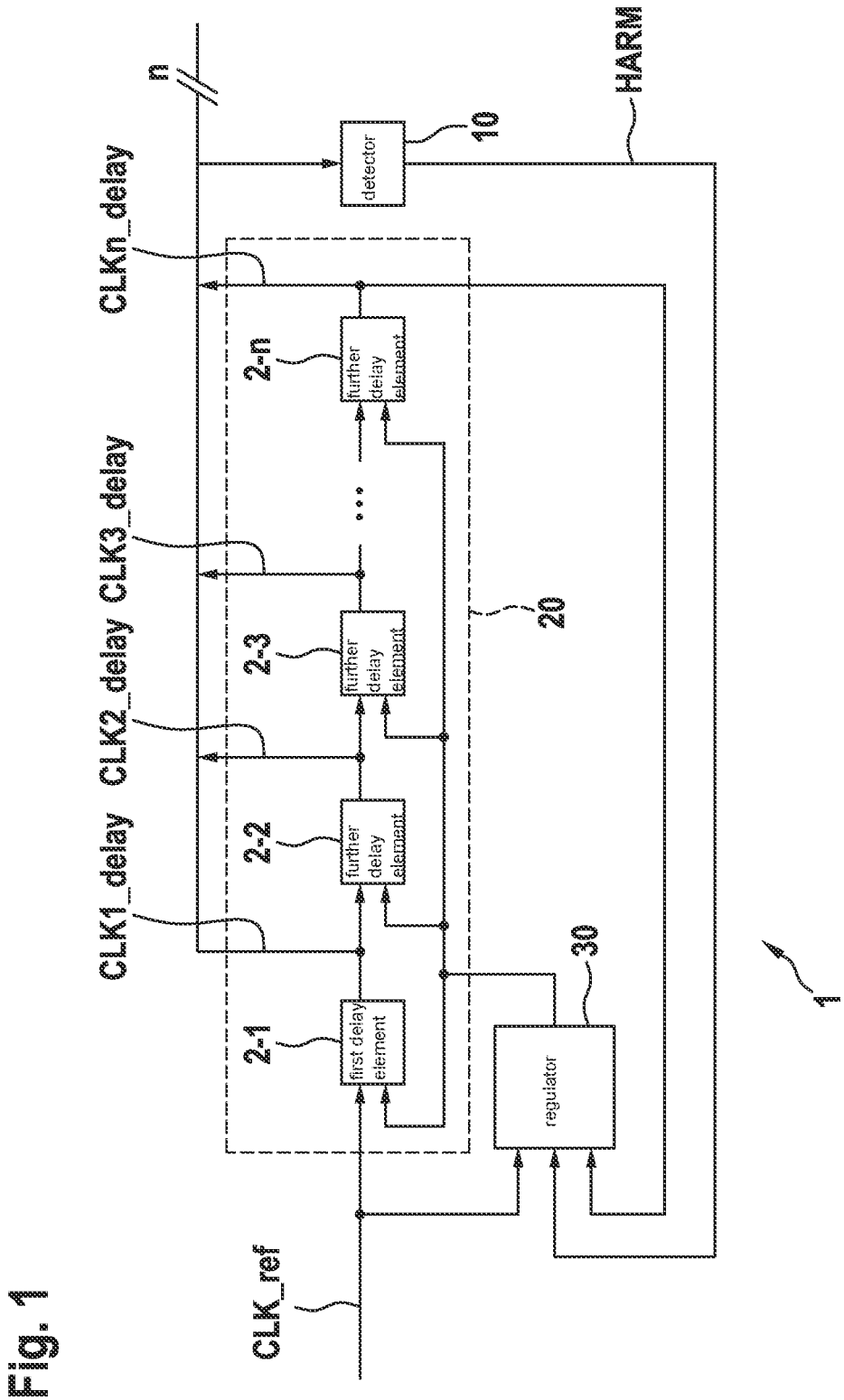
FIG. 1 shows a schematic representation of a block diagram of a DLL comprising a detector apparatus according to one example embodiment of the present invention.

FIG. 1 shows a schematic representation of a block diagram of a delay-locked loop (DLL) 1 according to one embodiment. The DLL 1 of this embodiment is based on a conventional DLL which was expanded by a detector apparatus 10 for detecting a harmonic state in the DLL 1. Accordingly, the regulating device 30 of the DLL 1 is also expanded by an additional control device 31 which, when a harmonic state is detected in the DLL 1, intervenes in the control loop of the DLL 1 in order to transfer the DLL from the harmonic state into the basic state.

A reference clock signal CLK_ref is provided at an input terminal of the DLL 1. This reference clock signal CLK_ref is supplied to a delay block 20. The delay block 20 comprises a series circuit comprising a plurality of delay elements 2-1 to 2-$n$. The reference clock signal CLK_ref is thus provided at the input of the first delay element 2-1. The output signal of the preceding delay element 2-1 to 2-($n$−1) is respectively provided at the input of each further delay element 2-2 to 2-$n$. The outputs of the individual delay elements 2-1 to 2-$n$ are provided as output signals via corresponding clock lines CLK <n>_delay. In addition, for detecting a harmonic state, at least two of the delayed clock signals are provided at the detector apparatus 10. The function of this detector apparatus 10 is explained in more detail below. Furthermore, the delayed clock signal of the last delay element 2-$n$ is provided at the regulating device 30. The regulating device 30 compares the reference clock signal CLK_ref provided at the input of the DLL 1, to the delayed clock signal of the last delay element 2-$n$. On the basis of this comparison, in particular an evaluation of a phase difference between the two received signals, the regulating device 30 generates a control signal. This control signal is provided at the delay elements 2-1 to 2-$n$ of the delay block 20. On the basis of this control signal from the regulating device 30, the delay time in the individual delay elements 2-1 to 2-n can be adjusted or set. In particular, it is the goal of the regulating device 30 to adjust the individual delay times in the delay elements 2-i in such a way that the sum of the delays corresponds to the period duration of the reference clock signal CLK_ref. In the case of such a delay, the DLL 1 is in the basic state.

In addition to the basic state of the DLL 1, it is however also possible for a harmonic state to arise in the DLL 1. In this case, a state in which the period duration of the reference clock signal CLK_ref corresponds to a multiple of the sum of the delays of the delay elements 2-i in the group 20 of the delay elements is referred to as a harmonic state. Such harmonic states are generally not desired. It is therefore a goal of the DLL 1 according to this embodiment to recognize such harmonic states. Suitable countermeasures can then be initiated. For example, when a harmonic state is detected, the regulating device 30 can modify the delay times of the delay elements 2-i in order to transfer the DLL from the harmonic state into the basic state. For this purpose, an output signal HARM of the detector apparatus 10 can be provided at the regulating device 30. In this way, the detection of a harmonic state in the DLL 1 can be signaled to the regulating device 30 so that the regulating device 30 can correspondingly adjust the delay times of the delay elements 2-i.

Figure 2:
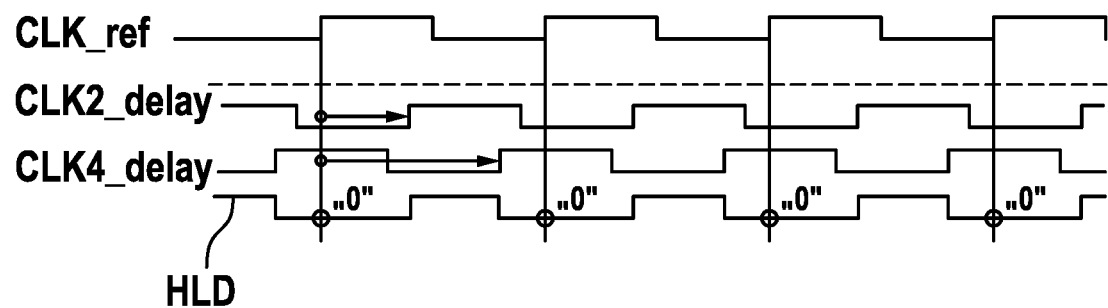
FIG. 2 shows a schematic representation of a temporal sequence of clock signals in a DLL in a basic state.

FIG. 2 shows a diagram for illustrating the temporal sequence of delayed clock signals in a DLL 1. In the example shown here, a group 20 with five delay elements 2-i or a corresponding multiple thereof is assumed. However, this example only serves as an exemplary illustrative example for understanding the underlying principle and does not constitute a limitation of the present invention.

The reference clock signal CLK_ref is shown in the uppermost line. The delayed clock signal CLK2_delay after the second delay element 2-2 is initially shown thereunder. The delayed clock signal CLK4_delay after the fourth delay element 2-4 is shown thereunder. In the lowermost line, an auxiliary signal HLD is shown, on the basis of which a harmonic state of the DLL 1 can be detected. The auxiliary signal HLD is generated using the delayed clock signals CLK<i>_delay shown. In the example shown here, the auxiliary signal HLD changes to a high signal level "1" if the delayed clock signal CLK2_delay before the second delay element 2-2 has a rising edge, i.e., changes from zero to one. Furthermore, the auxiliary signal HLD changes from the high signal level to the low signal level "0" if the delayed clock signal CLK4_delay from the fourth delay element 2-4 has a rising edge, i.e., changes from zero to one. Such a generated auxiliary signal HLD now indicates at the time points of the rising edge of the reference clock signal CLK_ref whether or not a harmonic state is detected in the DLL 1. If the auxiliary signal HLD has a low signal level ("0") at a rising edge of the reference clock signal CLK_ref, the DLL 1 is in the basic state. If the auxiliary signal HLD has a high signal level ("1") at the time point of the rising edge of the reference clock signal CLK_ref, a harmonic state of the DLL 1 is detected.

Figure 3:
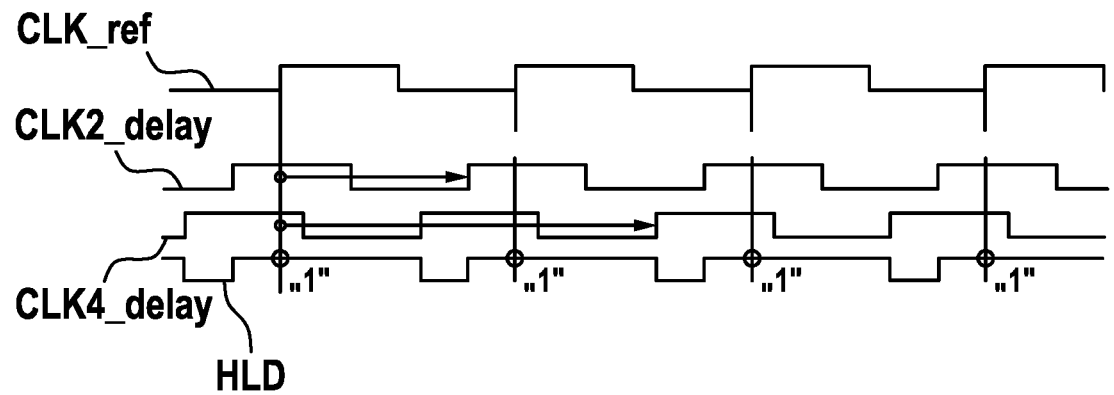
FIG. 3 shows a schematic representation of a temporal sequence of clock signals of a DLL in a harmonic state.

FIG. 3 shows a schematic representation of a temporal sequence of clock signals in a DLL 1 in a harmonic state of the DLL 1, in particular with double the delay time. In addition, the same assumptions apply to the structure of the DLL 1 as already described above in connection with FIG. 2, i.e., a group 20 with five delay elements 2-i.

As can be seen in the upper line of FIG. 3, a reference clock signal CLK_ref corresponding to the reference clock signal CLK_ref of FIG. 2 is the basis in this case. However, as can additionally be seen in the second and third lines in FIG. 3, the individual delay elements 2-i in this case have a delay time that is twice as long. The auxiliary signal HLD shown in the lowermost line is formed, analogously to the rule already described above, on the basis of the delayed clock signals CLK2_delay and CLK4_delay shown. In the case of a rising edge of the first selected delayed clock signal CLK2_delay, the auxiliary signal HLD changes to a high signal level ("1"). In the case of a rising edge of the second selected delayed clock signal CLK4_delay, the auxiliary signal HLD changes to a low signal level ("0"). Thus, in this case, the auxiliary signal HLD thus formed has a high signal level ("1") at the time points of a rising edge of the reference clock signal CLK_ref. A harmonic state can thus be detected in this case.

The above-described examples of a DLL 1 with five delay elements 2-i serve here merely as an example for illustrating the basic principle. However, the detection of harmonic states in a DLL 1 is not limited to this specific configuration. Rather, it is basically possible to use a detection of harmonic states in a DLL 1 with any number of a plurality of delay elements 2-i. The individual selection of the delayed clock signals, on the basis of which harmonic states are detected, as well as the number of the delayed clock signals to be considered in the detection of harmonic states can vary depending on the configuration and requirement.

For example, in the case of a group 20 of n delay elements 2-1 to 2-n, at least one delayed clock signal from the first half of delay elements 2-1 to 2-(n/2) and at least one delayed clock signal from the second half of the delay elements 2-(n/2) to 2-n can be used. In particular, a first and a second delayed clock signal CLK<i>_delay can respectively be evaluated, wherein twice as many delay elements 2-i are arranged between an input of the DLL 1 and the second delayed clock signal as between the input of the DLL and the first delayed clock signal.

In order to increase the reliability and in particular also to detect higher harmonic states, more than two delayed clock signals can in particular also be used. This is explained in more detail below.

Figure 4:
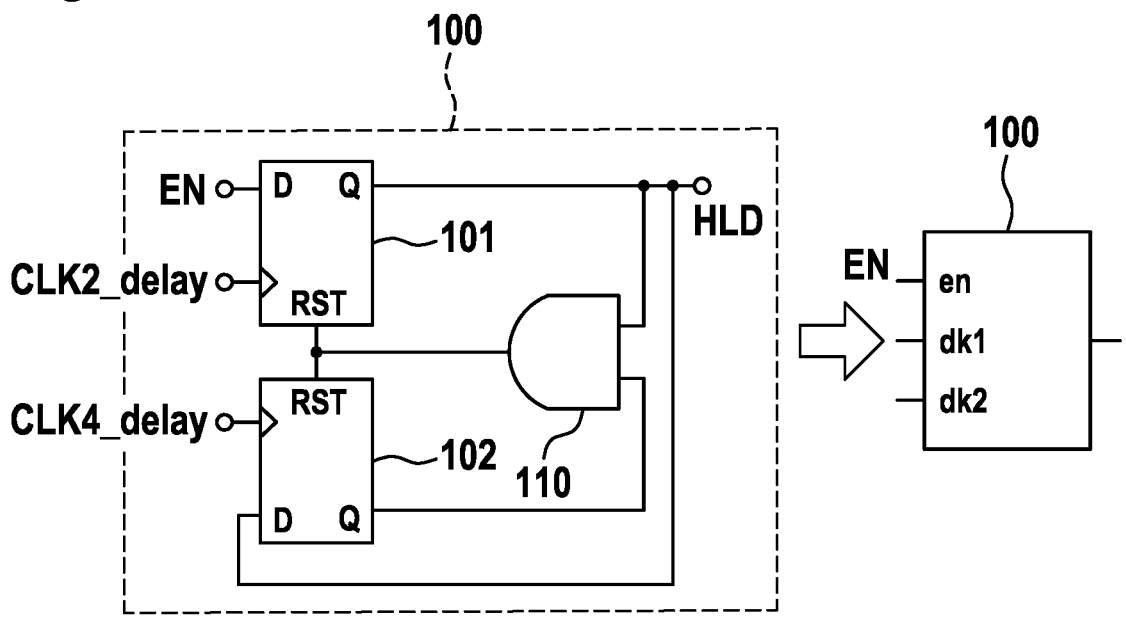
FIG. 4 shows a schematic representation of a block diagram of a detector stage for a detector apparatus according to one example embodiment of the present invention.

FIG. 4 shows a schematic representation of a block diagram of a detector stage 100, as it can be implemented, for example, for generating an auxiliary signal HLD in a detector apparatus 10 according to one embodiment. As can be seen here, the detector stage 100 comprises a first D flip-flop 101 and a second D flip-flop 102. The two D flip-flops 101 and 102 can in particular be clock-edge-controlled D flip-flops. For example, an activation signal EN can be provided at the D input of the first flip-flop 101. If this activation signal EN changes to logic one, the detection of harmonic states is activated. A first delayed clock signal is provided at the clock input of the first flip-flop 101. This signal can, for example, be referred to as a "set tap." In the simplified form shown on the right, this signal is, for example, provided at the input dk1. The second delayed clock signal is provided at the clock input of the second flip-flop 102. The D input of the second flip-flop 102 is connected to the output of the first flip-flop 101. This signal can, for example, be referred to as a "reset tap." In the simplified form shown on the right, this signal is, for example, provided at the input dk2. In addition, the detector stage 100 comprises an AND gate 110. The two inputs of the AND gate 110 are each connected to an output of the two flip-flops 101 and 102. The output of the AND gate 110 is connected to the reset inputs of the two flip-flops 101 and 102. Such a detector stage makes it possible to generate an auxiliary signal HLD described above for detecting a harmonic state in a DLL 1.

Figure 5:
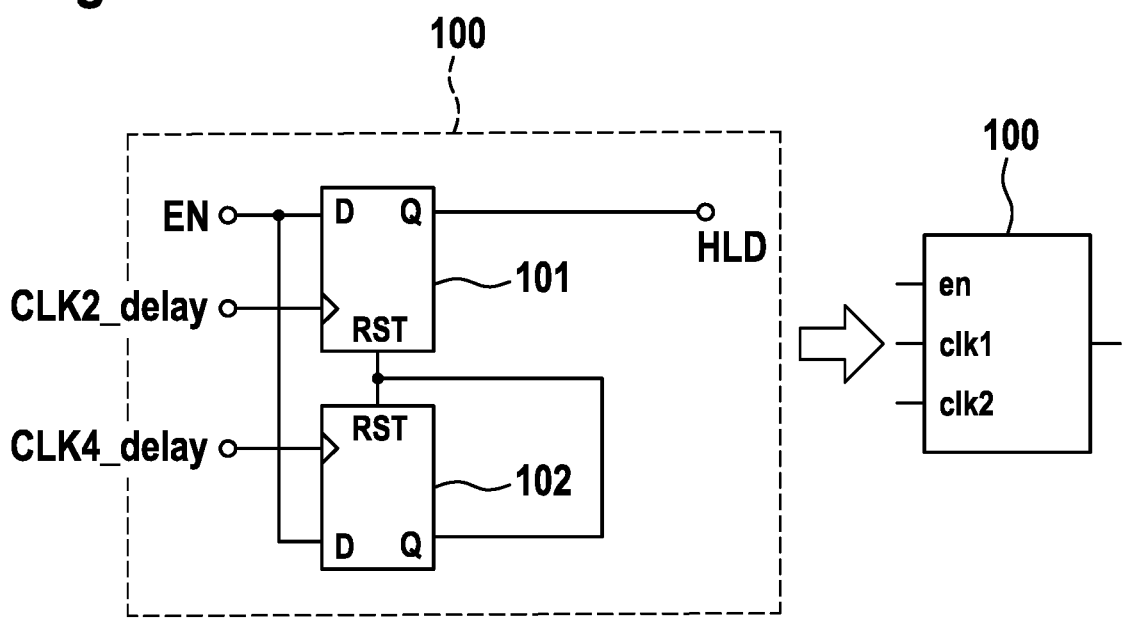
FIG. 5 shows a schematic representation of a detector stage according to an alternative embodiment of the present invention.

FIG. 5 shows a schematic representation of a block diagram of a detector stage for a detector apparatus 100 according to an alternative embodiment. The detector stage 100 shown in FIG. 5 differs from the above-described detector stage 100 in particular in that the AND gate 110 is omitted. In this embodiment, the two D inputs of the flip-flops 101 and 102 are both respectively connected to the activation input. The reset inputs of both flip-flops 101 and 102 are connected to the output of the second flip-flop 102. The auxiliary signal HLD is in this case provided at the output of the first flip-flop 101. The working speed of the detector stage 100 can be increased in this way. This results in increased robustness against parametric variations.

Figure 6:
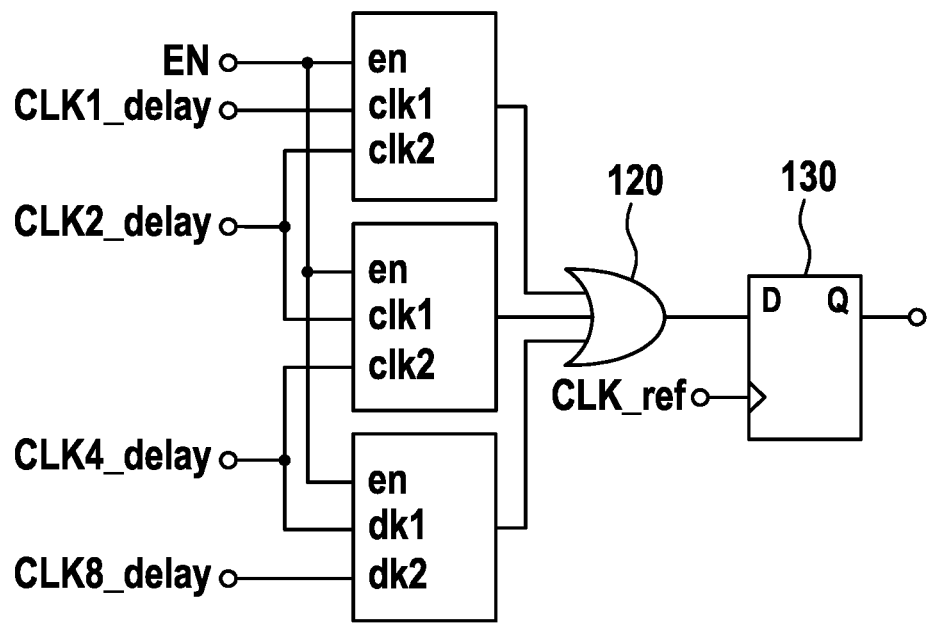
FIG. 6 shows a schematic representation of an interconnection of a plurality of detector stages for a detector apparatus according to one example embodiment of the present invention.

FIG. 6 shows a schematic representation of a block diagram of a detector apparatus 10 with a plurality of detector stages 100. Here too, the detector apparatus 10 shown by way of example with three detector stages 100 and the associated evaluation of four delayed clock signals CLK<i>_delay is to be understood only as a possible illustrative example. Depending on the application, any other number of delayed clock signals CLK<i>_delay can of course also be evaluated by means of a correspondingly suitable number of detector stages 100.

For evaluating more than two delayed clock signals CLK<i>_delay, as shown in FIG. 6, a plurality of detector stages 100 can be combined in a cascade-like manner. The output signals HLD provided by the respective detector stages 100 are linked by means of an OR gate 120, and the output signal of this OR gate 120 is provided at a signal input of a further flip-flop 130. The reference clock signal CLK_ref is provided at the clock input of the further flip-flop 130. In this way, the signal HARM, which signals a harmonic state of the DLL 1, can be provided at the output of the further edge-clock-controlled flip-flop 130. In the same way, in the above-described examples in connection with FIGS. 4 and 5, the auxiliary signal HLD can also be supplied to a flip-flop 130 in order to generate, from the auxiliary signal HLD, the signal HARM for signaling a harmonic state.

For example, a group 20 of delay elements 2-$i$ with ten delay elements 2-$i$ is assumed for the exemplary embodiment shown in FIG. 6. In addition, any desired scaling of a group 20 of delay elements 2-$i$ with a multiple of ten delay elements 2-$i$ is of course also possible. In addition, the basic principle described here of a cascade-like arrangement of a plurality of detector stages for evaluating more than two delayed clock signals CLK<i>_delay can also be adjusted correspondingly for any further combinations of delayed clock signals CLK<i>_delay and corresponding detector stages 100.

In the exemplary embodiment shown here, the delayed clock signal CLK1_delay after a first delay stage 2-1 (of, for example, ten delay stages) and a delayed clock signal CLK2_delay after the second delay stage 2-2 can be provided at a first detector stage 100a. The delayed clock signal CLK2_delay of the second delay element 2-2 is also provided at the second detector stage 100b and so is the delayed clock signal CLK4_delay after the fourth delay element 2-4. Finally, the delayed clock signal CLK4_delay after the fourth delay element 2-4 is also provided at the third detector stage 100c and so is the delayed clock signal CLK8_delay after the eighth delay element 2-8. Such a detector apparatus enables, for example, detection of harmonic states up to ten times the period duration of the reference clock signal CLK_ref.

Figure 7:
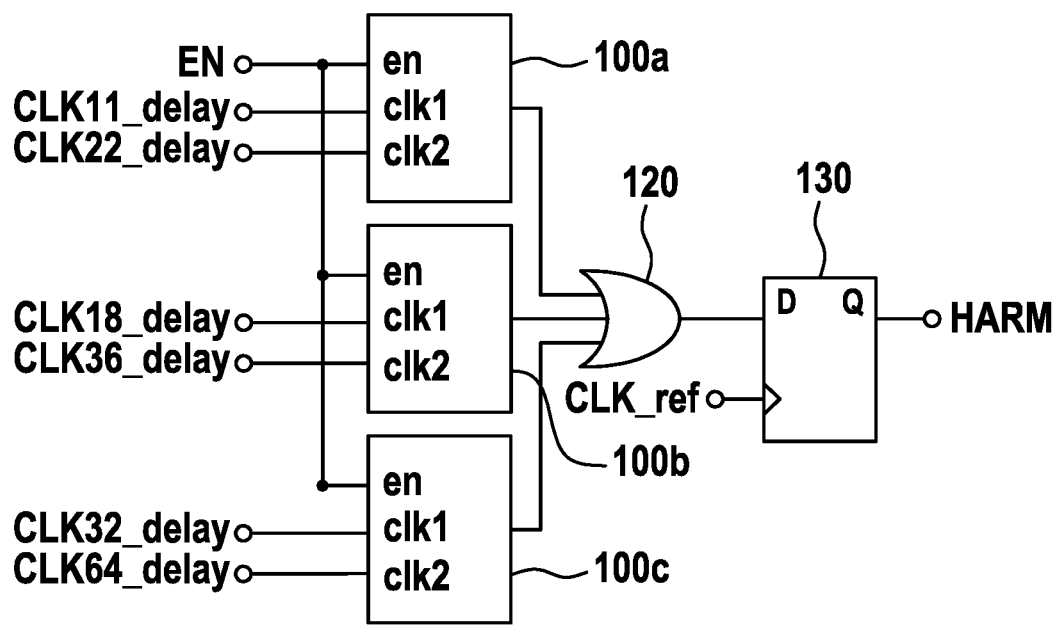
FIG. 7 shows a schematic representation of an interconnection of a plurality of detector stages for a detector apparatus according to a further embodiment of the present invention.

In order to additionally increase the robustness of the detector apparatus for detecting harmonic states in the DLL 1 and in particular to take into account the finite processing speed of the components, overlapping delayed clock signals can be provided at the individual detector stages 100 in a detector apparatus 10 with a plurality of detector stages 100. The term "overlapping" in this context is to be understood to mean that, in the cascade-like arrangement of a plurality of detector stages 100, at a detector stage 100, a delayed clock signal CLK<i>_delay is provided that is less delayed than the more delayed clock signal CLK<i>_delay of the adjacent detector stage 100. Such an arrangement with three detector stages 100 is shown by way of example for the case of a group 20 of eighty delay elements 2-$i$ in FIG. 7. For example, the delayed clock signals CLK<i>_delay of the eleventh delay element 2-11 and of the twenty-second delay element 2-22 (of, for example, eighty delay elements) are provided at the first detector stage 100a. The delayed clock signals CLK<i>_delay of the eighteenth delay element 2-18 and of the thirty-sixth delay element 2-36 (of the eighty delay elements 2-$i$) are provided at the second detector stage 100b. For example, the delayed clock signals CLK<i>_delay of the thirty-second delay element 2-32 and of the sixty-fourth delay element 2-64 (of the exemplary eighty delay elements 2-$i$) are provided at the third detector stage 100c. This circuit concept, as well as the concept described below, can also easily be adjusted to larger ranges and is particularly robust against parametric variations due to a significantly greater overlap.

Figure 8:
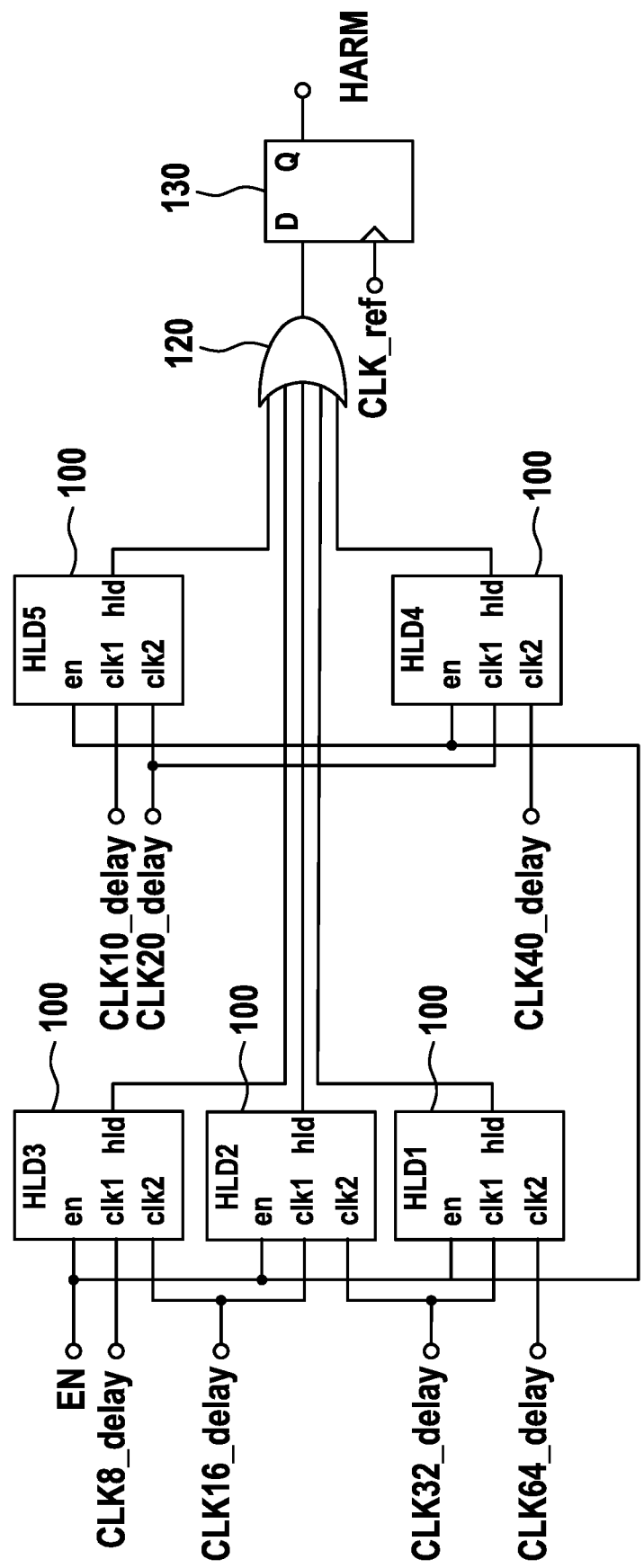
FIG. 8 shows a schematic representation of an interconnection of a plurality of detector stages for a detector apparatus according to yet a further example embodiment of the present invention.

FIG. 8 shows a further alternative embodiment of a detector circuit 10 for evaluating more than two delayed clock signals CLK<i>_delay. The embodiment shown here is based in particular on the embodiment described above in connection with FIG. 6 and was expanded by two further detector stages 100d and 100e. Provided at the two additional detector stages 100d and 100e are in this case delayed clock signals CLK<i>_delay, the origin of which is in each case located between the delayed clock signals CLK<i>_delay from the delay elements 2-$i$, which are used for the first three detector stages 100a, 100b, and 100c. In the example shown in FIG. 8, for an exemplary case of eighty delay elements 2-$i$, the delayed clock signals CLK<i>_delay of the eighth and sixteenth delay elements 2-$i$ can, for example, be provided at a first detector stage 100a. In this case, the delayed clock signals CLK<i>_delay of the sixteenth and thirty-second delay elements 2-$i$ can, for example, be provided at the second detector stage 100b. The delayed clock signals CLK<i>_delay of the thirty-second and sixty-fourth delay elements 2-$i$ can accordingly be provided at the third detector stage 100c. The delayed clock signals CLK<i>_delay of the tenth and twentieth delay element 2-$i$ on the one hand and those of the twentieth and fortieth delay elements 2-$i$ can accordingly be provided at the two additional detector stages 100d and 100e. The auxiliary signals HLD of all detector stages 100 are linked by an OR gate 120, and the output of the OR gate 120 is provided at the signal input of a further flip-flop 130. The reference clock signal CLK_ref is applied at the clock input of the edge-controlled D flip-flop 130. A signal that signals a harmonic state of the DLL 1 is thus present at the output of the further flip-flop 130.

Figure 9:
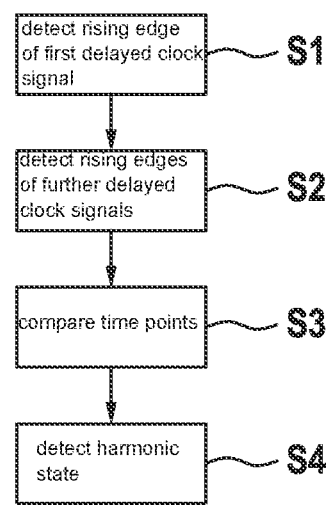
FIG. 9 shows a schematic representation of a flowchart, as underlying a method for detecting a harmonic state according to one example embodiment of the present invention.

FIG. 9 finally shows a schematic representation of a flowchart, as underlying a method for detecting a harmonic state in a DLL. In step S1, a rising edge of a first delayed clock signal is detected within the DLL 1. Correspondingly, rising edges of one or more further, delayed clock signals can be detected in further steps S2. In step S3, the time points of the detected rising edges of the delayed clock signals are compared to one another. A harmonic state in the DLL 1 is then detected in step S4 on the basis of the time points of the rising edges in the delayed clock signals.

In summary, the present invention relates to the detection of harmonic states in a delay-locked loop. To this end, a plurality of delayed clock signals within the delay-locked loop is evaluated and, on the basis thereof, in particular on the basis of the time points of the rising edges in the delayed clock signals, it is ascertained whether a harmonic state has arisen in the delay-locked loop.

The invention claimed is:

1. A detector apparatus configured to detect a harmonic state in a delay-locked loop (DLL), the DLL receiving a reference clock signal and including a feedback series circuit of a plurality of delay elements, the detector apparatus configured to:
   receive delayed clock signals from at least two of the delay elements of the DLL;
   compare the delayed clock signals from the at least two delay elements of the DLL to one another; and
   detect a harmonic state of the DLL based on the comparison, wherein the DLL is in the harmonic state when a sum of delays of the delayed clock signals corresponds to a multiple of a period duration of the reference clock signal.

2. The detector apparatus according to claim 1, wherein at least one of the at least two delayed clock signals is provided by a delay element of a first half of the series circuit of the plurality of delay elements, and at least one of the at least two delayed clock signals is provided by a delay element of a second half of the series circuit of the plurality of delay elements.

3. The detector apparatus according to claim 1, wherein the detector apparatus configured to detect the harmonic state of the DLL using time points of rising edges of the delayed clock signals from the at least two delay elements.

4. The detector apparatus according to claim 1, comprising at least one detector stage which is configured to receive delayed clock signals from two delay elements of the plurality of delay elements and to provide an output signal, wherein the at least one detector stage is configured to set the output signal as a function of edges of the received clock signals.

5. The detector apparatus according to claim 4, wherein each of the at least one detector stage includes two D flip-flops, and wherein a delayed output signal from a delay element of the plurality of delay elements is respectively provided at a clock input of each D flip-flop.

6. The detector apparatus according to claim 4, wherein, between an input of the DLL and a first input of a detector stage of the at least one detector stage at which a first delayed clock signal is provided, twice as many delay elements are provided as between the input of the DLL and a second input of the detector stage at which a second delayed clock signal is provided.

7. The detector apparatus according to claim 4, wherein the detector apparatus comprises at least two detector stages, and outputs of the at least two detector stages are linked to one another by a logical OR operation.

8. A regulating device for a delay-locked loop (DLL), comprising:
   a detector apparatus configured to detect a harmonic state in the DLL, the DLL receiving a reference clock signal and including a feedback series circuit of a plurality of delay elements, the detector apparatus configured to:
      receive delayed clock signals from at least two of the delay elements of the DLL;
      compare the delayed clock signals from the at least two delay elements of the DLL to one another; and
      detect a harmonic state of the DLL based on the comparison, wherein the DLL is in the harmonic state when a sum of delays of the delayed clock signals corresponds to a multiple of a period duration of the reference clock signal; and
   a control device configured to adjust a delay of the plurality of delay elements of the DLL if the detector apparatus has detected the harmonic state of the DLL.

9. A delay-locked loop (DLL), comprising:
   an input terminal configured to receive a reference clock signal;
   a plurality of delay elements, wherein the plurality of delay elements is arranged as a feedback series circuit, and wherein each respective delay element of the delay elements is configured to delay a clock signal provided at an input of the respective delay element by a predetermined delay time and to provide the delayed clock signal at an output of the respective delay element;
   a regulating device configured to adjust the predetermined delay time of the delay elements using an input clock signal and an output clock signal of the series circuit of the delay elements;
   a detector apparatus configured to detect a harmonic state in the DLL, the detector apparatus configured to:
      receive delayed clock signals from at least two of the delay elements of the DLL;
      compare the delayed clock signals from the at least two delay elements of the DLL to one another; and
      detect a harmonic state of the DLL based on the comparison, wherein the DLL is in the harmonic state when a sum of delays of the delayed clock signals corresponds to a multiple of a period duration of the reference clock signal; and
   a control device configured to adjust a delay of the plurality of delay elements of the DLL if the detector apparatus has detected the harmonic state of the DLL.

10. A method for detecting a harmonic state in a delay-locked loop (DLL), the DLL receiving a reference clock signal and including a feedback series circuit of a plurality of delay elements, the method comprising the following steps:
   receiving delayed clock signals from at least two of the delay elements of the DLL;
   comparing the delayed clock signals from the at least two delay elements of the DLL to one another; and
   detecting a harmonic state of the DLL based on the comparison, wherein the DLL is in the harmonic state when a sum of delays of the delayed clock signals corresponds to a multiple of a period duration of the reference clock signal.

* * * * *